United States Patent

Bograng et al.

[11] Patent Number: 5,984,252
[45] Date of Patent: Nov. 16, 1999

[54] ARRANGEMENT FOR MOUNTING A BASE STATION

[75] Inventors: Mats Bograng, Stockholm; Nils-Göran Larsson; Alpo Öhman, both of Lidingö, all of Sweden

[73] Assignee: Telefonaktiebolaget LM Ericsson, Stockholm, Sweden

[21] Appl. No.: 08/948,835

[22] Filed: Oct. 10, 1997

Related U.S. Application Data

[63] Continuation of application No. PCT/SE96/00457, Apr. 9, 1996.

[30] Foreign Application Priority Data

Apr. 11, 1995 [SE] Sweden .................................. 9501349

[51] Int. Cl.⁶ .......................................................... A47H 1/10
[52] U.S. Cl. ........................................... 248/317; 248/343
[58] Field of Search ............................. 248/205.1, 309.1, 248/317, 324, 343, 291.1; 312/223.1

[56] References Cited

U.S. PATENT DOCUMENTS

| 2,715,560 | 8/1955 | Felburg | 312/223.1 |
| 3,637,918 | 1/1972 | Pasen | 248/65 |
| 4,109,252 | 8/1978 | Hacker et al. | 248/539 |
| 4,449,764 | 5/1984 | Hastings | 312/223.1 |
| 5,044,284 | 9/1991 | Gross | 248/242 |

FOREIGN PATENT DOCUMENTS

| 1 277 348 | 6/1972 | United Kingdom . |
| 2 030 782 | 4/1980 | United Kingdom . |

Primary Examiner—Ramon O. Ramirez
Attorney, Agent, or Firm—Burns, Doane, Swecker & Mathis, L.L.P.

[57] ABSTRACT

To mount a base station to be suspended in a hanger, the base station is provided with a first device for detachable, pivotable attachment to a corresponding device on the hanger to enable the base station to be pivoted from the hanger, and a second device for detachable, fixed attachment to a corresponding device on the hanger.

9 Claims, 2 Drawing Sheets

ARRANGEMENT FOR MOUNTING A BASE STATION

This application is a continuation of International Application No. PCT/SE96/00457, filed Apr. 9, 1996, which designates the Unites States.

TECHNICAL FIELD

The invention relates to an arrangement for mounting a base station.

BACKGROUND OF THE INVENTION

Base stations known so far, are set up in switching centers, in leased spaces, in containers in the countryside or in outdoor cabinets.

The base stations of today are quite bulky and thereby difficult to site. To lease spaces for base stations will most often be very expensive, particularly in the cities where it, on the whole, can be very difficult to find suitable spaces. In view of the expected expansion of mobile telephone networks, it will be even more difficult to find such spaces in the future. Moreover, to install and service base stations in narrow spaces is very difficult.

SUMMARY

The object of the invention is therefore to bring about a base station which is easy to install as well as to service.

This is attained by means of the arrangement according to the invention in that the base station which is to hang in a hanger, is provided with first means for detachable, pivotable attachment to corresponding means on the hanger to enable the base station to be pivoted from the hanger, and second means for detachable, fixed attachment to corresponding means on the hanger.

BRIEF DESCRIPTION OF THE DRAWING

The invention will be described more in detail below with reference to the appended drawing on which

DETAILED DESCRIPTION

Figure 1:
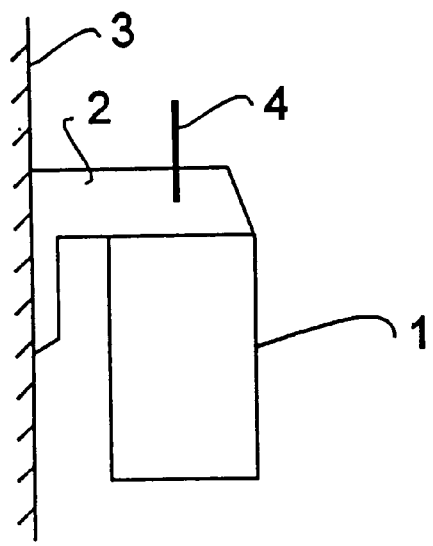
FIG. 1 is a schematical lateral view of an embodiment of a base station according to the invention, which hangs in a hanger fixed to a wall.

FIG. 1 is a schematical lateral view of a base station 1 according to the invention, which hangs in a hanger 2 which, in the embodiment shown, is fixed to a wall 3 in a manner not shown in any detail. The hanger 2 does not necessarily have to be fixed to a wall but can of course be fixed to any other suitable structure such as e.g. a post.

To improve the cooling of the base station 1 by convection, the hanger 2 is adapted to keep the base station 1 hanging at a distance from the wall 3.

The cooling of the base station 1 can be further improved in that it is provided with cooling flanges (not shown).

4 denotes an antenna which according to the invention is fixed to the hanger 2 in a manner not shown in any further detail.

Figure 2:
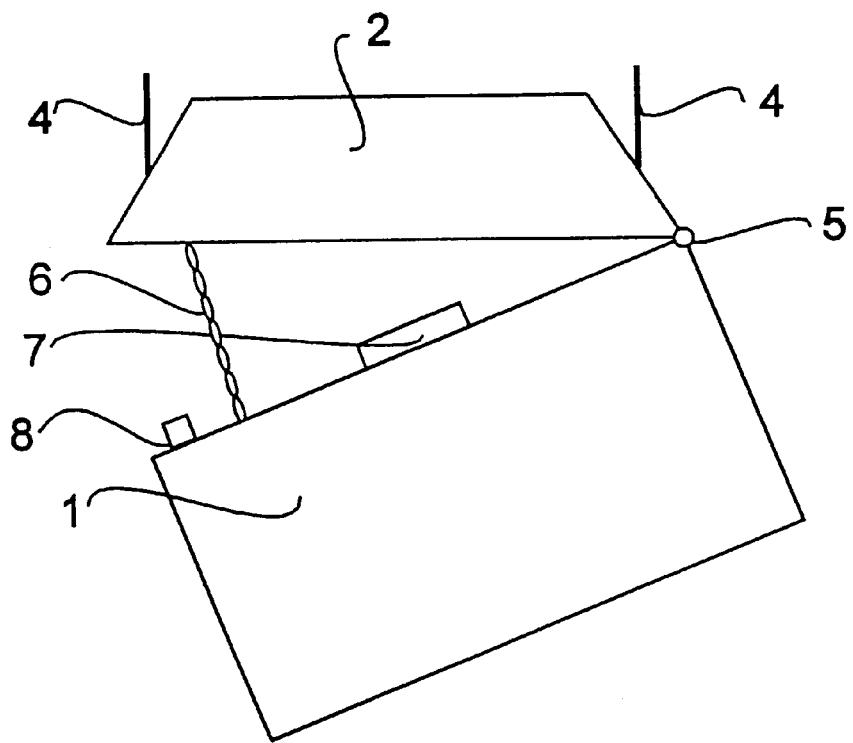
FIG. 2 is a schematical front view of the base station according to FIG. 1 in a pivoted position.

FIG. 2 shows the base station 1 according to the invention in a pivoted position relative to the hanger 2.

In the embodiment of the base station 1 shown in FIGS. 1 and 2, it has essentially the form of a right angled parallelepiped.

To facilitate a simple installation of the base station 1 and to improve the accessability when servicing the base station 1, in accordance with the invention, the base station is pivotably attached to the hanger 2 along one of its upper short sides. In the embodiment shown in FIG. 2, the base station 1 is fixed to the hanger 2 by means of a detachable hinge joint 5, one half of which being fixed to the hanger 2 in a manner not shown in any further detail, and the other half of which being fixed to the base station 1 in a manner not shown in any further detail.

To carry the weight of the base station 1 in the hanger 2 in the pivoted position according to FIG. 2, the base station 1 and the hanger 2 are provided with means for affixing a safety chain 6 between the units.

According to the invention, the hanger 2 holds transmission and power supply wires (not shown) to be connected to the base station 1. 7 denotes a connection block on the base station 1, which, when the base station 1 is pivoted towards the hanger 2, makes contact with contact pins (not shown) provided in the hanger 2.

In many cases, instead of a connection block/contact pins, it can be better to electrically connect the base station 1 with the hanger 2 by means of one or more cables.

To lock the base station 1 to the hanger 2 in its raised position in accordance with FIG. 1, the base station 1 according to the invention in the embodiment shown in FIG. 2 is provided with a locking pin 8 which cooperates with locking means (not shown) in the hanger 2.

As apparent from FIG. 2, the hanger 2 is provided with two antennas 4, which also are connected to the base station 1 via the connection block 7.

In the hanger 2, also transient and lightning arresters (not shown) can be provided to be connected to the base station via the connection block 7.

Figure 3:
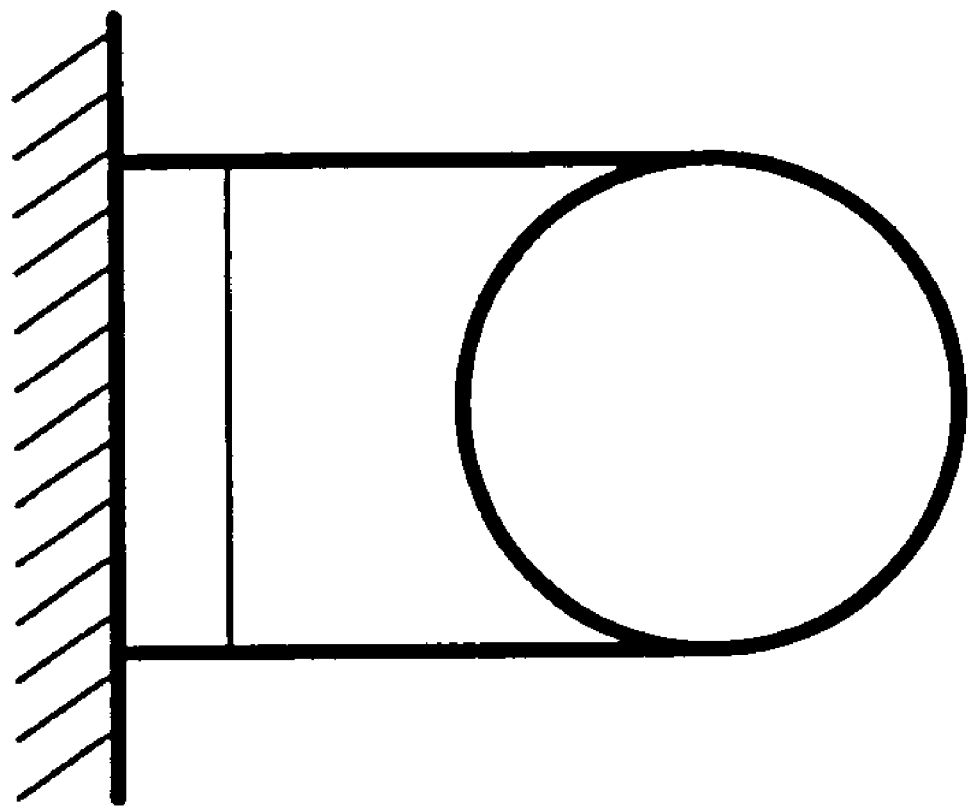
FIG. 3 is a bottom view of a base station according to an exemplary embodiment.

The base station 1 does not necessarily have to have the form of a right angled parallelepiped but can equally well be essentially cylindrical, as shown in FIG. 3 in which case the hinge joint 5 and the locking pin 8 preferably would be provided opposite each other along the periphery of the cylindrical base station.

When mounting a base station according to the invention, the hanger with its associated cabling is set up in advance, whereupon the base station is hung in its pivoted position in the hanger, and the safety chain is secured. Functional testing of the base station is then carried out, whereupon the base station is pivoted to its raised position and locked to the hanger to obtain electrical contact via the connection block with the corresponding contact pins in the hanger alternatively that one or more cables are connected between the base station and the hanger to obtain the desired electrical contact.

Upon more comprehensive servicing of the base station, it is moreover very easy to remove it for further transport to any central service function and at the same time replace the removed base station with a replacement base station in order to maintain the operation.

What is claimed is:

1. A system comprising a base station for communication, a hanger, and an arrangement for mounting the base station in the hanger, the arrangement comprising first means for detachable, pivotable attachment to corresponding means on the hanger to enable the base station to be pivoted downwardly from the hanger, toward a center of gravity, and second means for detachable, fixed attachment to corresponding means on the hanger.

2. The system of claim 1, wherein the base station substantially has the form of a right angled parallelepiped which along its respective upper short sides is provided with the first and second means.

3. The system of claim 1, wherein the base station is substantially cylindrical and at the top at diametrically opposed positions along the periphery is provided with the first and second means.

4. The system of claim 1, wherein the first means on the base station and the corresponding means on the hanger form a detachable hinge joint.

5. The system of claim 1, wherein the hanger, which is to be fixed to a substantially vertical structure, is adapted to keep the base station hanging at a distance from the substantially vertical structure.

6. The system of claim 1, wherein the hanger is adapted to carry transmission and power supply wires to be connected to the base station.

7. The system of claim 1, wherein the hanger is adapted to carry antennas to be connected to the base station.

8. The system of claim 1, wherein the hanger is adapted to carry transient and lightning arresters to be connected to the base station.

9. The system of claim 1, wherein the base station and the hanger are provided with means for securing a safety chain between the units.

* * * * *